United States Patent
Higuchi

(10) Patent No.: US 8,102,294 B2
(45) Date of Patent: Jan. 24, 2012

(54) SOLID-STATE IMAGE SENSOR

(75) Inventor: Tsuyoshi Higuchi, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 316 days.

(21) Appl. No.: 12/563,485

(22) Filed: Sep. 21, 2009

(65) Prior Publication Data

US 2010/0079634 A1    Apr. 1, 2010

(30) Foreign Application Priority Data

Sep. 29, 2008  (JP) .................................. 2008-250872

(51) Int. Cl.
*H03M 1/12*  (2006.01)
(52) U.S. Cl. ...................... 341/156; 250/208.1; 348/308; 348/294; 348/297
(58) Field of Classification Search ........... 341/150–170; 250/208.1; 348/302, 308, 297, E5.091, E5.031, 348/222.1, 294
See application file for complete search history.

(56) References Cited

U.S. PATENT DOCUMENTS

| | | | | |
|---|---|---|---|---|
| 4,773,076 A | * | 9/1988 | Yamamoto et al. | 372/50.21 |
| 7,671,317 B2 | * | 3/2010 | Shimomura et al. | 348/308 |
| 7,777,170 B2 | * | 8/2010 | Murakami et al. | 341/169 |
| 7,880,662 B2 | * | 2/2011 | Bogaerts | 341/169 |
| 2008/0136948 A1 | | 6/2008 | Muramatsu | |
| 2009/0256735 A1 | * | 10/2009 | Bogaerts | 341/169 |
| 2010/0194956 A1 | * | 8/2010 | Yuan et al. | 348/308 |
| 2010/0277632 A1 | * | 11/2010 | Murakami et al. | 348/297 |
| 2011/0095926 A1 | * | 4/2011 | Bogaerts | 341/155 |
| 2011/0095929 A1 | * | 4/2011 | Bogaerts | 341/169 |
| 2011/0122274 A1 | * | 5/2011 | Itzhak et al. | 341/155 |
| 2011/0205100 A1 | * | 8/2011 | Bogaerts | 341/169 |

FOREIGN PATENT DOCUMENTS

| | | |
|---|---|---|
| JP | 2006-303752 A | 11/2006 |
| JP | 2007-281987 A | 10/2007 |

* cited by examiner

*Primary Examiner* — Lam T Mai
(74) *Attorney, Agent, or Firm* — Arent Fox LLP

(57) ABSTRACT

A solid-state image sensor includes a pixel array, and an analog to digital converter for converting a voltage signal read from the pixel array from analog to digital form, wherein the analog to digital converter includes a counter counting a first clock signal for a period depending on a voltage value of the voltage signal, and wherein a least significant bit of a count value of the counter is determined based on an exclusive OR of outputs of two 1-bit counters operating at a frequency of the first clock signal.

6 Claims, 8 Drawing Sheets

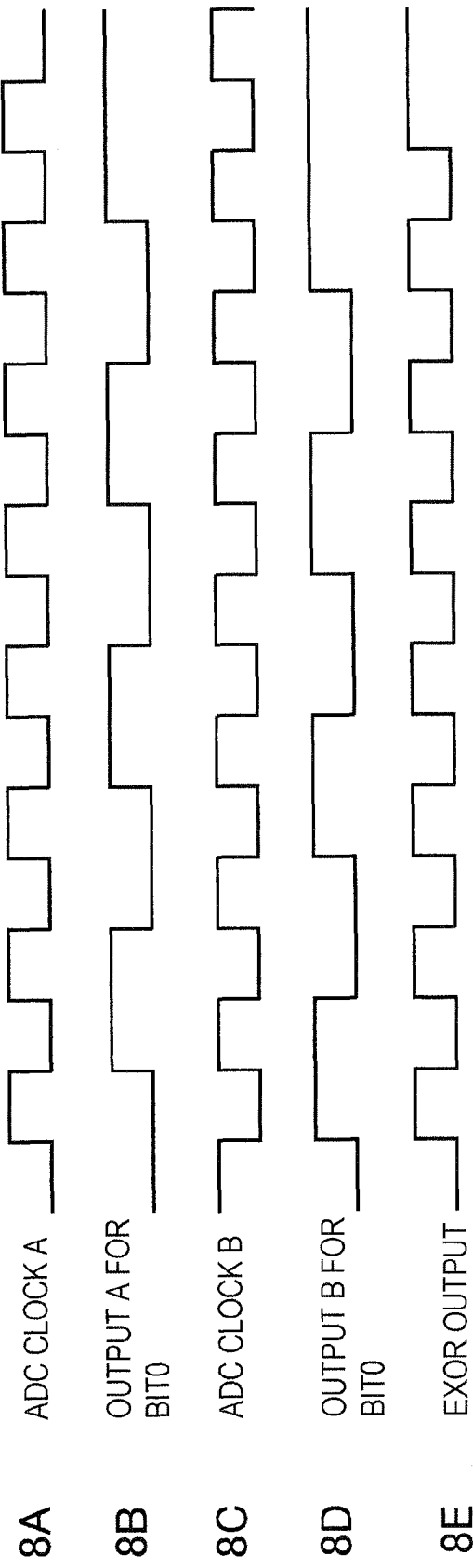

SOLID-STATE IMAGE SENSOR

CROSS-REFERENCE TO RELATED APPLICATIONS

This application is based upon and claims the benefit of priority of the prior Japanese Patent Application No. 2008-250872, filed on Sep. 29, 2008, the entire contents of which are incorporated herein by reference.

FIELD

The embodiment discussed herein is related to a solid-state image sensor.

BACKGROUND

A solid-state image sensor using a column analog to digital converter (A/D converter) reads a voltage signal, which depends on the intensity of received light, from each row of a pixel array and converts the voltage signal from analog to digital form from one row to another. In the analog to digital conversion (AD conversion or ADC), a lamp voltage signal indicating a voltage that linearly increases due to accumulating charge in a capacitor using a constant current source is generated, and the generated lamp voltage signal is compared with a read pixel voltage signal. A digital value depending on the read pixel voltage may be obtained as a count value of a counter by measuring a length of time that it takes for a voltage of the lamp voltage signal ("lamp voltage") to become equal to or exceed a voltage of the read pixel voltage signal ("read pixel voltage").

FIG. 1 illustrates a configuration of the column A/D converter. The column A/D converter in FIG. 1 includes an ADC determination circuit 10, an AND circuit 11, 1-bit counters 12-1 to 12-4, latches 13-1 to 13-4, and a shift register 14. Column A/D converters configured substantially the same as the column A/D converter in FIG. 1 are provided in the pixel array and each of the column A/D converters is arranged in each row of the pixel array. For example, the column A/D converter in FIG. 1 is an A/D converter that outputs a 4-bit digital value.

The read pixel voltage is applied to the ADC determination circuit 10. The ADC determination circuit 10 compares the lamp voltage signal with the read pixel voltage signal. When the lamp voltage is equal to or exceeds the read pixel voltage, the ADC determination circuit 10 allows an output signal to transition from a high state to a low state. The AND circuit 11 supplies the 1-bit counter 12-1 with an ADC clock while an output of the ADC determination circuit 10 is in the high state. The AND circuit 11 stops supplying the ADC clock to the 1-bit counter 12-1 when the output of the ADC determination circuit 10 transitions to the low state. At the time at which operations for the AD conversion start, the timing at which the AND circuit 11 starts outputting the clock signals is set to correspond to the timing at which the voltage of the lamp voltage signal starts to increase.

The 1-bit counter 12-1 receives the ADC clock as an input and performs a toggle operation. The 1-bit counter 12-2 receives an output of the 1-bit counter 12-1 as an input and performs a toggle operation. The 1-bit counter 12-3 receives an output of the 1-bit counter 12-2 as an input and performs a toggle operation. The 1-bit counter 12-4 receives an output of the 1-bit counter 12-3 as an input and performs a toggle operation. As a result, the 1-bit counters 12-1 to 12-4 operate as a 4-bit counter. Since the time that it takes for the AND circuit 11 to stop supplying the ADC clock is proportional to the read pixel voltage, the count value of the 4-bit counter is a digital value obtained through the AD conversion of the read pixel voltage. The 4-bit digital value is stored in the latches 13-1 to 13-4 at a desired timing. The shift register 14 selectively couples the latches 13-1 to 13-4 to buses Bus0 to Bus3.

FIG. 2 is a diagram illustrating signal timing relative to operations of the column A/D converter in FIG. 1. In FIGS. 2, 2A represents a clock signal for a count of the ADC (the ADC clock), 2B represents the output of the 1-bit counter 12-1 (bit0), 2C represents the output of the 1-bit counter 12-2 (bit1), 2D represents the output of the 1-bit counter 12-3 (bit2), 2E represents an output of the 1-bit counter 12-4 (bit3), 2F represents a count value of the 4-bit counter, and 2G represents a state of the latches 13-1 to 13-4.

The diagram in FIG. 2 illustrates a case where an input analog voltage (the read pixel voltage) has a highest value and the 4-bit digital value, after undergoing the AD, conversion is 15. The digital values represented by bits bit0 to bit3 are sequentially counted up when the bit bit0 is the least significant bit and the bit bit3 is the most significant bit. In this case, the count values indicated with 4 bits, namely, the bits bit0 to bit3 are synchronized with the ADC clock and increase from zero to 15. Each of the latches 13-1 to 13-4 holds a previous value while 2G in FIG. 2 indicates "Hold," and latches current values of the bits bit0 to bit3 at the timing corresponding to the timing at which a highest count value is obtained, that is, the timing at which 2G in FIG. 2 indicates "Transfer." In other words, the current values of the bits bit0 to bit3 are transferred to the buses as the latch outputs.

In the column A/D converter as described above, when the bit counts of the output digital values are considered to be fixed, increasing a frequency of the ADC clock may reduce time needed for capturing an image, which is called a "frame period," by an amount corresponding to the increased frequency of the ADC clock. In other words, to achieve a desired frame period with a resolution of a desired AD conversion, that is, with a desired bit count, the frequency of the ADC clock needs to be higher than a certain degree. When high-speed captures of images with a high resolution are required, the ADC clock having a frequency high enough to satisfy such requirements needs to be used. However, in the A/D converter described above, the least significant 1-bit counter 12-1 is synchronized with a pulse of the ADC clock and performs a count operation. When the 1-bit counter 12-1 operates faster, influences of noises may grow and the accuracy of the AD conversion may be reduced. In another case, the frequency of the ADC clock higher than the frequency of the system clock may be needed and a circuit such as a phase-locked loop (PLL) circuit may be needed.

SUMMARY

According to an aspect of an embodiment, a solid-state image sensor includes a pixel array, and an analog to digital converter for converting a voltage signal read from the pixel array from analog to digital form, wherein the analog to digital converter includes a counter counting a first clock signal for a period depending on a voltage value of the voltage signal, and wherein a least significant bit of a count value of the counter is determined based on an exclusive OR of outputs of two 1-bit counters operating at a frequency of the first clock signal.

The objects and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 illustrates generation of the least significant output bit based on the two clock signals in the column A/D converter in FIG. 7.

DESCRIPTION OF EMBODIMENT

An embodiment is described in detail below with reference to the accompanying drawings.

Figure 3:
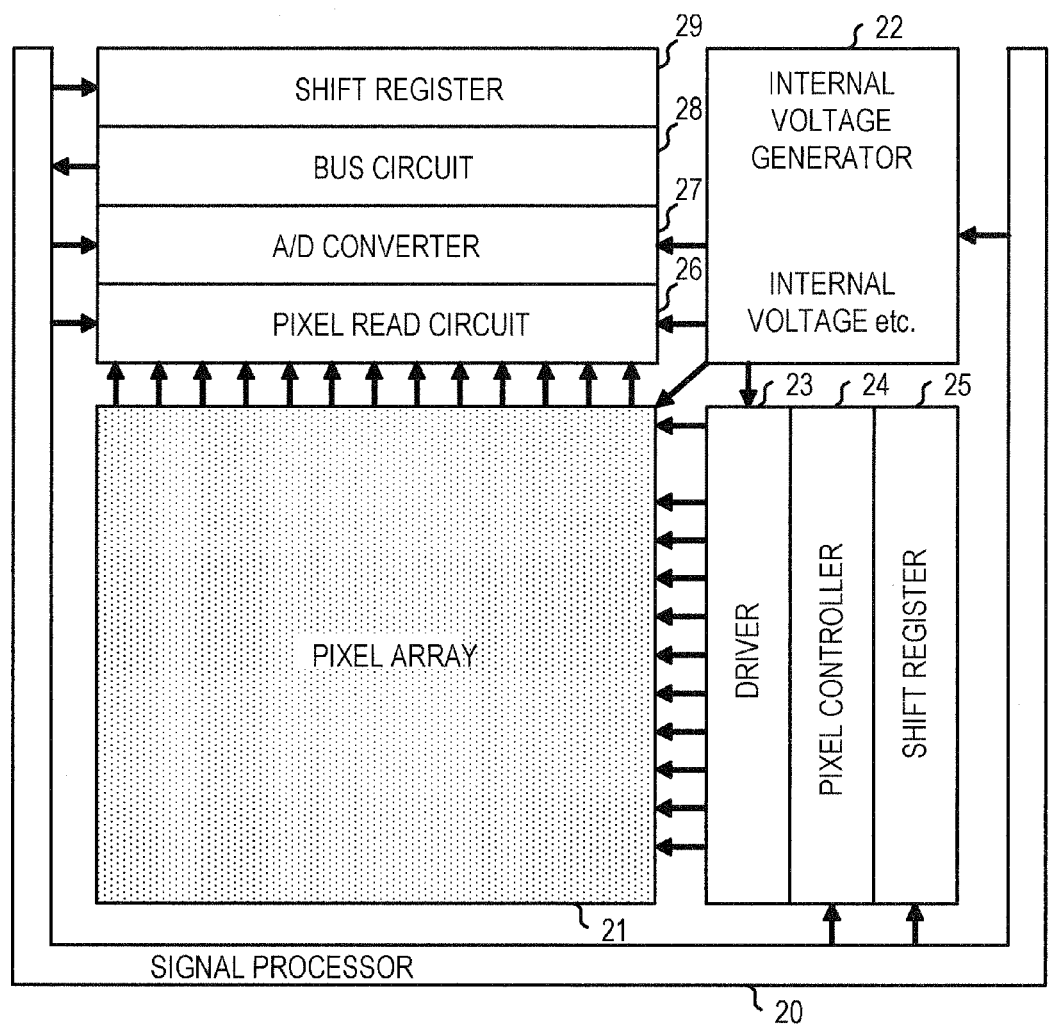
FIG. 3 illustrates a solid-state image sensor according to an aspect of an embodiment.

FIG. 3 illustrates a configuration of a solid-state image sensor. The solid-state image sensor in FIG. 3 includes a signal processor 20, a pixel array 21, an internal voltage generating circuit 22, a driver 23, a pixel controller 24, a shift register 25, a pixel read circuit 26, an A/D converter 27, a bus circuit 28, and a shift register 29. The pixel array 21 includes pixels arranged in a matrix in the row and column directions and each of the pixels includes, for example, MOS transistors and a photodiode. Each of the pixels accumulates charge depending on the intensity of received light.

The shift register 25 includes a row of registers arranged in the direction in which a column number increases or decreases to correspond to the columns of the pixel array 21. Further, the shift register 25 sequentially designates the columns in each of which the charge is read from each of the pixels. The pixel controller 24 generates a control signal for reading a signal for the pixel column designated by the shift register 25 and generates a control signal for performing initialization or a reset operation for the pixels. The driver 23 drives each pixel column of the pixel array 21 in accordance with the control signal from the pixel controller 24.

The pixel read circuit 26 includes read circuits arranged in the direction in which a row number increases or decreases to correspond to the rows of the pixel array 21. Further, the pixel read circuit 26 converts, with respect to each row (each pixel of the designated column), the signal charge read from the designated column of the pixel array 21 into the voltage signal. The A/D converter 27 includes A/D converters arranged in the direction in which the row number increases or decreases to correspond to the rows of the pixel arrays 21. Further, the A/D converter 27 performs the AD conversion for the voltage signal of each row, that is, each of the pixels of the designated column, to which the pixel read circuit 26 outputs the converted voltage signal. The A/D converter 27 transmits the digital data indicating the value as the result of the AD conversion of each of the pixel read voltages. The bus circuit 28 latches the pixel data corresponding to a column, which is supplied by the A/D converter 27. The shift register 29 includes a row of registers arranged in the direction in which the row number increases or decreases to correspond to the rows of the pixel array 21 and sequentially designates the row positions at each of which the pixel data is read from the bus circuit 28. Thus, the pixel data corresponding to a column, which is stored in the bus circuit 28, is sequentially supplied to the signal processor 20.

The internal voltage generating circuit 22 generates various internal voltages depending on a power supply voltage supplied from the outside to supply the pixel array 21, the driver 23, the pixel read circuit 26, the A/D converter 27, etc. with the generated internal voltages. The internal voltages include a read voltage and a reset voltage that are supplied to the pixel array 21, and a lamp voltage supplied to the A/D converter 27.

The signal processor 20 controls operations of each part of the solid-state image sensor and performs signal processing for the read pixel data. The signal processing includes correlated double sampling (CDS), automatic gain control (AGC), white balance adjustment, conversions into red, green, and blue (RGB) signals or luminance chrominance (YUV) signals.

Figure 4:
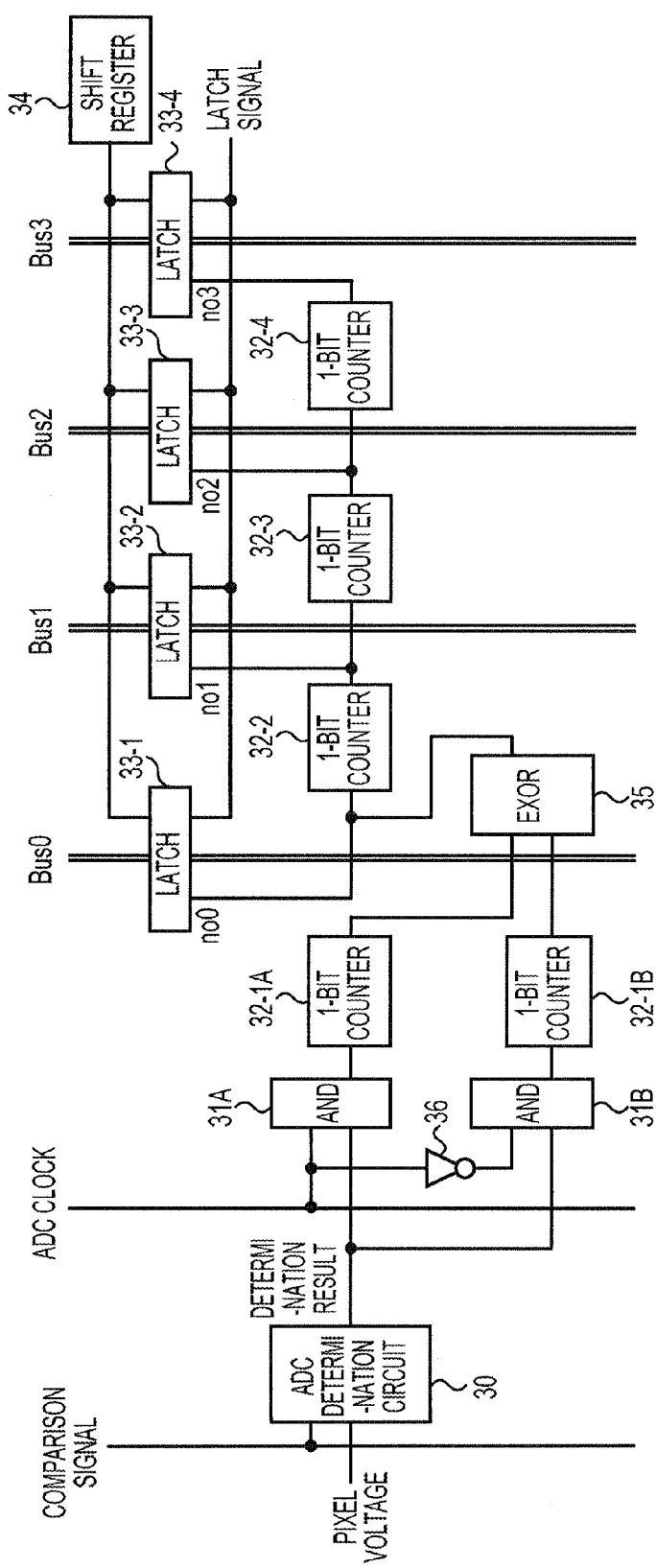
FIG. 4 illustrates a column A/D converter included in the A/D converter in FIG. 3 and corresponding to a row of the pixel array in FIG. 3.

FIG. 4 illustrates a configuration of a column ND converter included in the A/D converter 27 and corresponding to a row of the pixel array 21. The column A/D converter in FIG. 4 includes an ADC determination circuit 30, AND circuits 31A and 31B, 1-bit counters 32-1A and 32-1B for the least significant bit, 1-bit counters 32-2 to 32-4 for the second to fourth bits, latches 33-1 to 33-4, a shift register 34, an EXOR circuit 35, and an inverter 36 (not depicted in FIG. 4). Column A/D converters configured substantially the same as the column A/D converter in FIG. 4 are provided in the pixel array 21 and each of the column A/D converters corresponds to each row of the pixel array 21, and all of the column A/D converters form the A/D converter 27 in FIG. 3. FIG. 4 illustrates a column A/D converter that outputs a 4-bit digital value. However, the bit count is not limited to four. The A/D converter may be configured such that the digital value having a desired number of bit counts depending on a desired AD conversion resolution may be output.

A pixel voltage read by the pixel read circuit 26 in FIG. 3 is applied to the ADC determination circuit 30. The ADC determination circuit 30 compares the lamp voltage signal with the read pixel voltage signal and when the lamp voltage is equal to or exceeds the read pixel voltage, allows the output signal to transition from the high state to the low state. The AND circuit 31A supplies the ADC clock to the 1-bit counter 32-1A while an output of the ADC determination circuit 30 is in the high state. The AND circuit 31A stops supplying the ADC clock to the 1-bit counter 32-1A when the output of the ADC determination circuit 30 transitions to the low state. Similarly, the AND circuit 31B supplies the inverted clock of the ADC clock to the 1-bit counter 32-1B while the output of the ADC determination circuit 30 is in the high state. The AND circuit 31B stops supplying the inverted clock to the 1-bit counter 32-1B when the output of the ADC determination circuit 30 transitions to the low state. When operations for the AD conversion start, the timings at which the AND circuits 31A and 31B start outputting the clock signals are set to correspond to the timing at which the voltage of the lamp voltage signal starts to increase.

Figure 5:
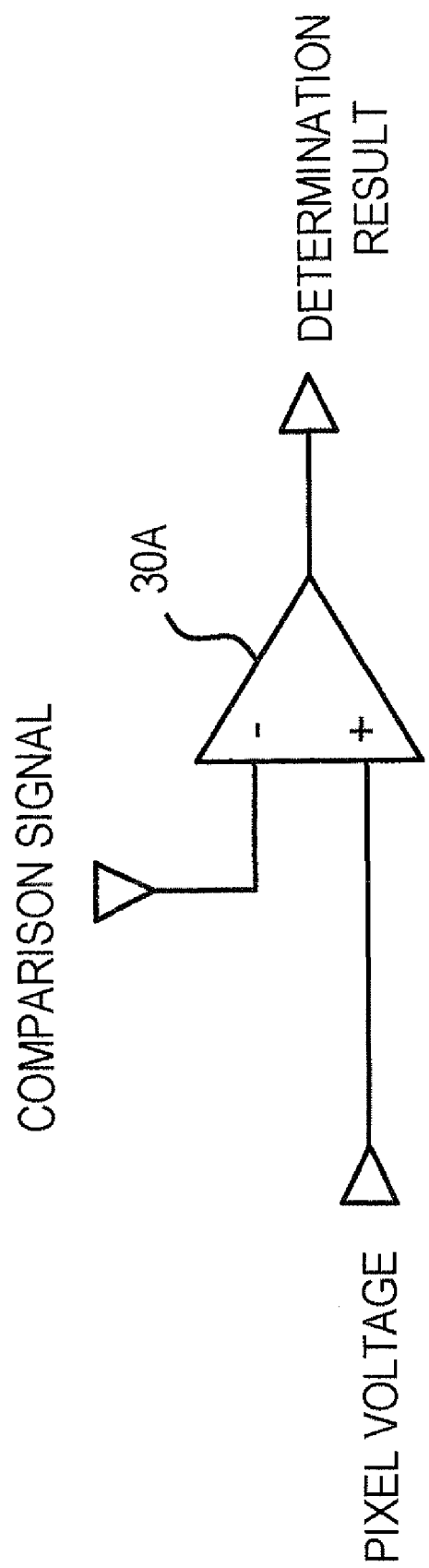
FIG. 5 illustrates a configuration of the ADC determination circuit in FIG. 4.

FIG. 5 illustrates a configuration of the ADC determination circuit 30. The ADC determination circuit 30 in FIG. 5 includes a comparison circuit 30A. The comparison circuit 30A receives a pixel voltage from the pixel read circuit 26 and receives a lamp voltage signal as a comparison signal. The lamp voltage signal may be generated as a terminal voltage of a capacitor. The terminal voltage of the capacitor may linearly increase due to accumulating charge in the capacitor with a constant current source. The comparison circuit 30A compares the lamp voltage signal with the read pixel voltage signal. When the lamp voltage is equal to or exceeds the read pixel voltage, the comparison circuit 30A allows the output signal to transition from the high state to the low state.

Referring to FIG. 4, the 1-bit counters 32-1A and 32-1B, the 1-bit counters 32-2 to 32-4, the latches 33-1 to 33-4, and the EXOR circuit 35 form the counter circuit that counts the clock signal for a length of time corresponding to the pixel voltage value. The least significant bit of the output count value of the counter circuit is determined based on an exclusive OR of outputs of the 1-bit counters 32-1A and 32-1B that operate at the frequency of the ADC clock.

For example, the 1-bit counter 32-1A receives the ADC clock as an input and performs a toggle operation. The 1-bit counter 32-1B receives the inverted clock of the ADC clock as an input and performs a toggle operation. The toggle operation here is an operation to invert the output signal from the high state to the low state and vice versa based on a given state transition, for example, a rise transition or a fall transition. The exclusive OR of the outputs of the 1-bit counters 32-1A and 32-1B is determined with the EXOR circuit 35 and an output of the EXOR circuit 35 is set to be the least significant bit of the output count value of the counter circuit.

The 1-bit counter 32-2 receives the output of the EXOR circuit 35 as an input and performs a toggle operation. The 1-bit counter 32-3 receives an output of the 1-bit counter 32-2 as an input and performs a toggle operation. The 1-bit counter 32-4 receives an output of the 1-bit counter 32-3 as an input and performs a toggle operation. Since the time that it takes for the AND circuits 31A and 31B to stop supplying the clock is proportional to the read pixel voltage, the count value of the 4-bit counter is a digital value obtained through the AD conversion of the read pixel voltage. The 4-bit digital value is stored in the latches 33-1 to 33-4 in response to the latch signal asserted at a desired timing. The shift register 34 selectively couples the latches 33-1 to 33-4 to the buses Bus0 to Bus3.

Figure 6:
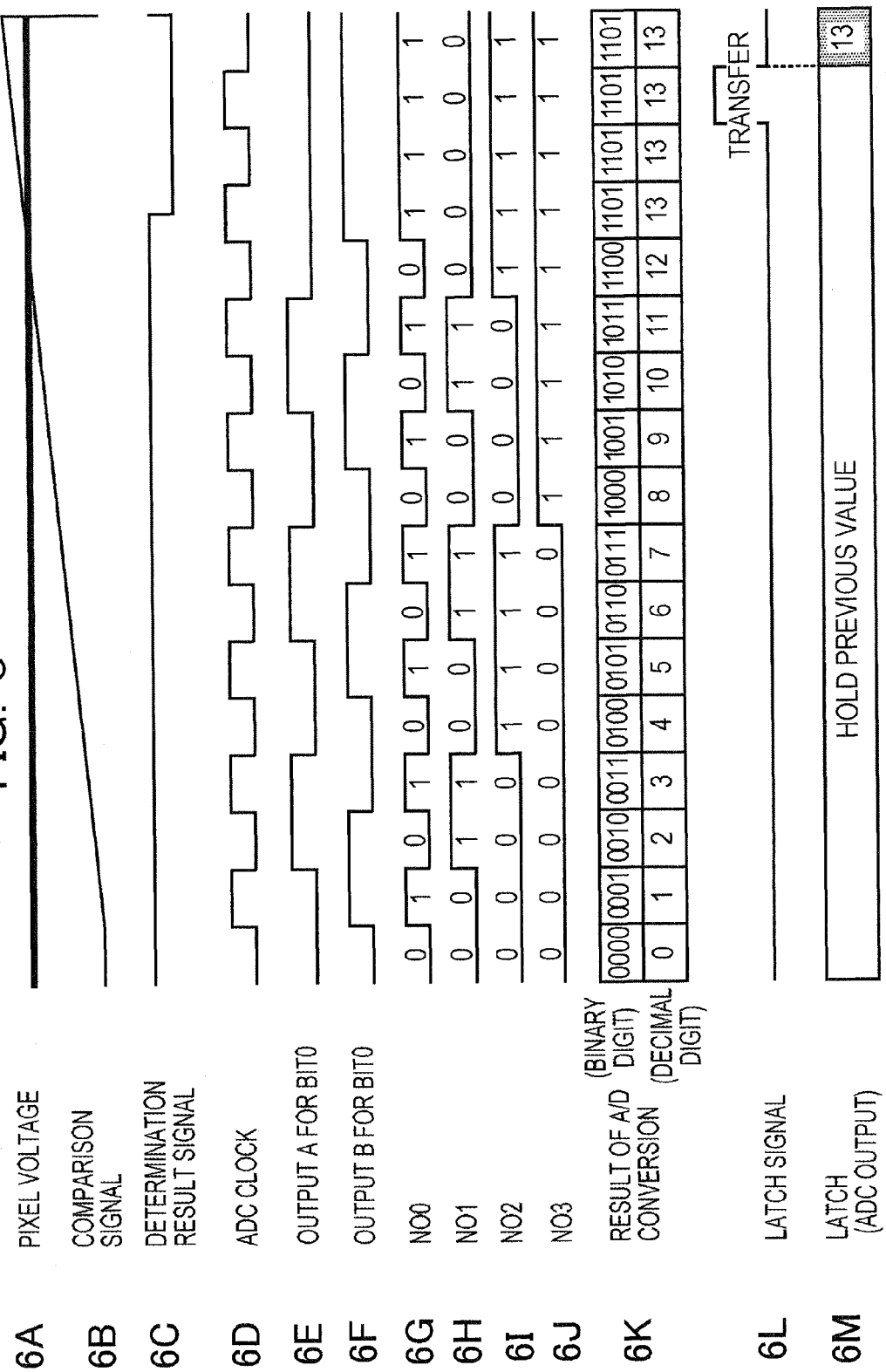
FIG. 6 is a diagram illustrating timings of signals, relative to operations of the column A/D converter in FIG. 4.

FIG. 6 is a diagram illustrating signal timing, relative to operations of the column A/D converter in FIG. 4. In FIGS. 6, 6A represents the pixel voltage, 6B represents the comparison signal (lamp voltage signal), and 6C represents a determination result signal that is the output of the ADC determination circuit 30. As illustrated in FIG. 6, the output of the ADC determination circuit 30 transitions from the high state to the low state when the lamp voltage signal becomes equal to or exceeds the pixel voltage.

In FIGS. 6, 6D represents the clock signal for the count of the ADC (the ADC clock). While the determination result signal, which is the output of the ADC determination circuit 30, is in the high state, the output of the 1-bit counter 32-1A, represented by 6E, is synchronized with a falling edge of the ADC clock through the toggle operation. While the determination result signal, which is the output of the ADC determination circuit 30, is in the high state, the output of the 1-bit counter 32-1B, represented by 6F in FIG. 6, is synchronized with a trailing edge of the ADC clock through the toggle operation.

A signal no0 represented by 6G in FIG. 6 is a signal indicating the least significant bit of the counter circuit and is the output of the EXOR circuit 35. The signal no0 is an exclusive OR of the signals represented by 6E and 6F in FIG. 6. A signal no1 represented by 6H in FIG. 6 is the output of the 1-bit counter 32-2. The signal no2 represented by 6I in FIG. 6 is the output of the 1-bit counter 32-3. The signal no3 represented by 6J in FIG. 6 is an output of the 1-bit counter 32-4. In FIG. 6, for example, 6K represents the count value of the 4-bit counter and the last count value corresponding to the pixel voltage is 13. When the lamp voltage signal is equal to or exceeds the pixel voltage, the determination result signal that is the output from the ADC determination circuit 30 transitions to the low state, and the count operation of the counter circuit stops with the count value, 13, that is held at the time.

In FIGS. 6, 6L represents the latch signal input to each of the latches 33-1 to 33-4 in FIGS. 4, and 6M represents the state of the latches 33-1 to 33-4. The latches 33-1 to 33-4 hold previous values during the "Hold" state in FIG. 6 and latches current values of the signals no0 to no3 at the timing corresponding to the timing at which a highest count value, 15, is obtained, that is, the timing of "Transfer" in FIG. 6. In other words, the current values of the signals no0 to no3 are transferred to the buses as the latch outputs.

Figure 1:
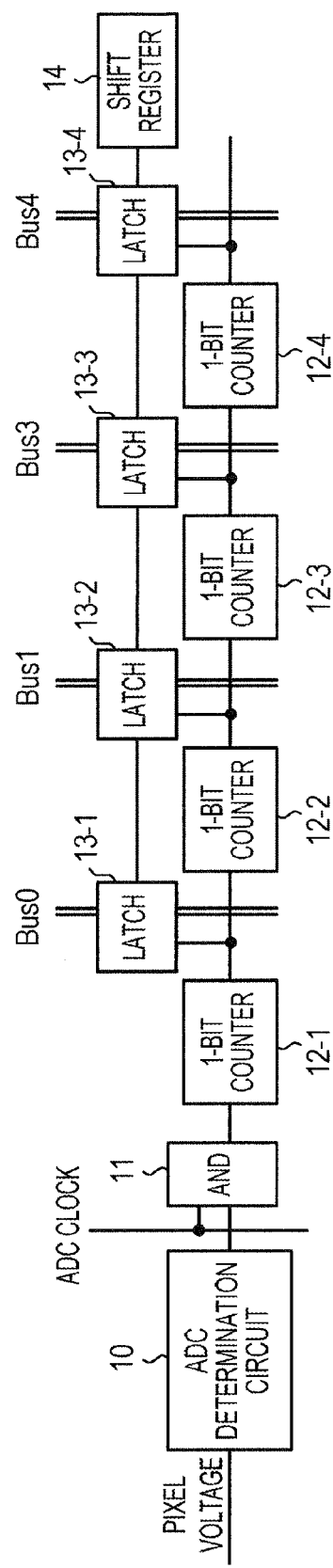
FIG. 1 illustrates a column A/D converter.
Figure 2:
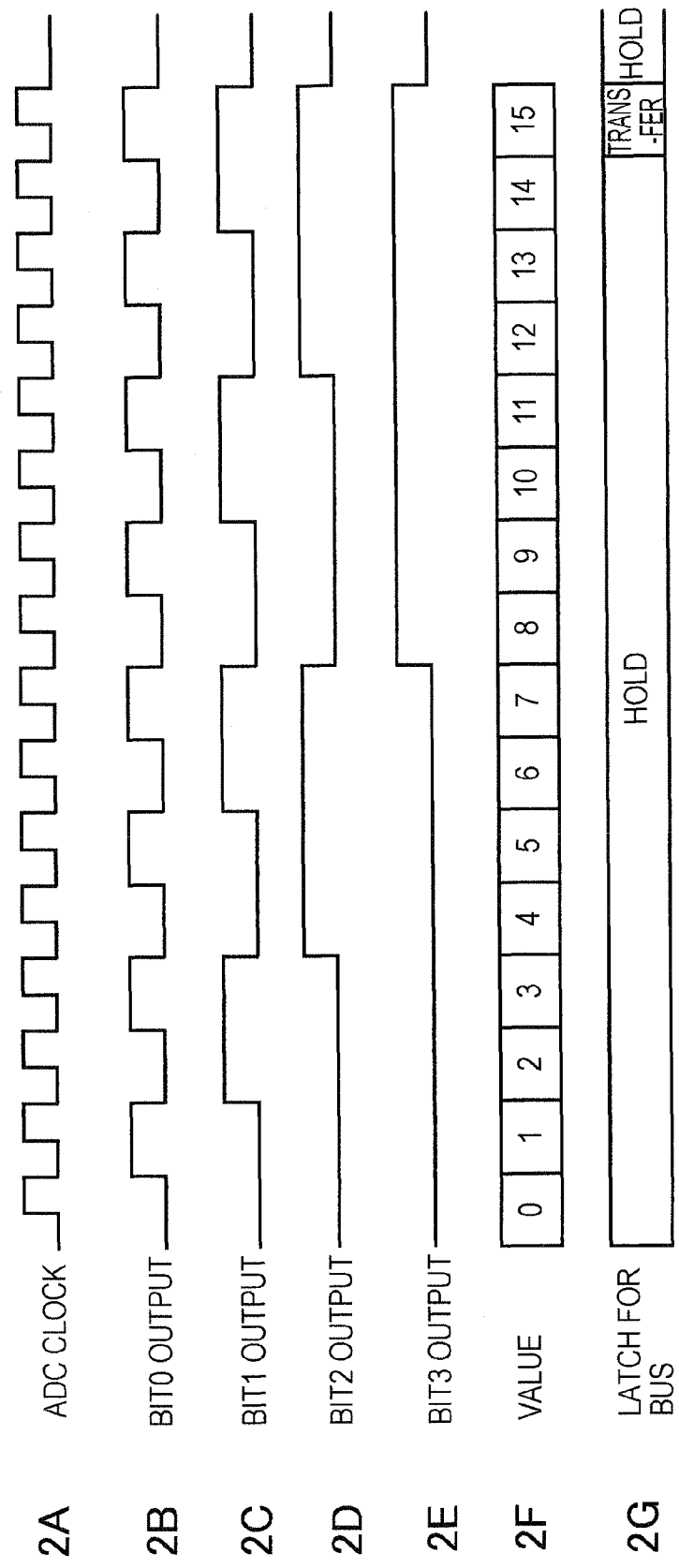
FIG. 2 is a diagram illustrating timings of signals, relative to operations of the column A/D converter in FIG. 1.

As illustrated in FIG. 6, the frequency of the ADC clock is substantially the same as the frequency of the least significant bit bit0 of the counter circuit. In FIG. 2, for example, the frequency of the ADC clock is twice as high as the frequency of the least significant bit bit0 of the counter circuit. Unlike the configuration in FIG. 1, the configuration in FIG. 4 may reduce the frequency of the clock signal for the count of the ADC by, for example, half when a given frame period is achieved with a given resolution of the AD conversion. Thus, since the operation frequencies of the 1-bit counters 32-1A and 32-16 may be reduced by, for example, half, influences of noises may be reduced and lowering of the accuracy of the AD conversion may be prevented.

Figure 7:
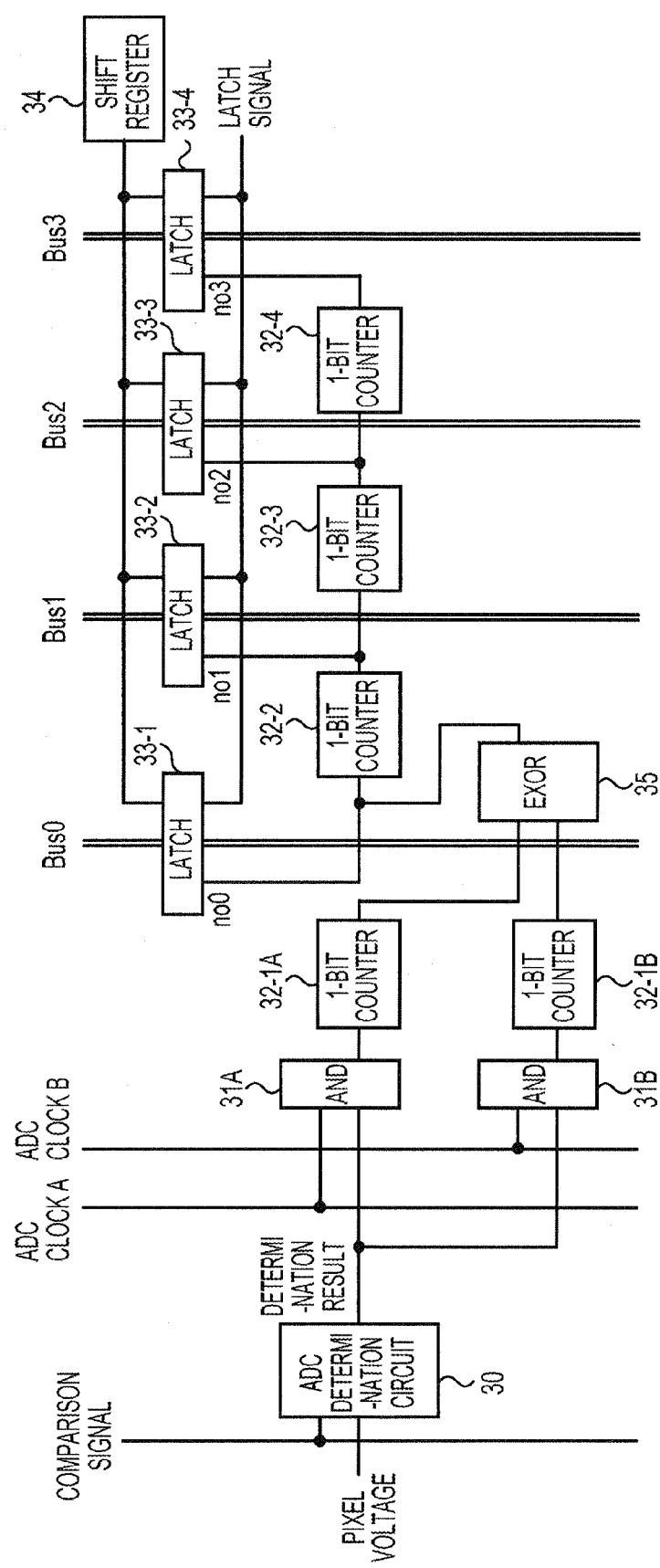
FIG. 7 illustrates another column A/D converter included in the A/D converter in FIG. 3 and corresponding to a row of the pixel array in FIG. 3.

FIG. 7 illustrates another column A/D converter included in the A/D converter in FIG. 3 and corresponding to a row of the pixel array in FIG. 3. In FIG. 7, the same elements as the elements in FIG. 4 are given the same reference numerals and detailed descriptions thereof are omitted. In the column A/D converter in FIG. 4, the inverter 36 generates the inverted clock of the ADC clock and supplies the inverted clock to the AND circuit 31B. To convert the voltage signals with pixels from analog to digital form, which are read from the designated column of the pixel array 21, an inverter that inverts the ADC clock is provided in each of the column A/D converters provided to correspond to each of the rows of the pixel array. In the column A/D converter in FIG. 7, the ADC clockA and the ADC clockB that is the inverted clock of the ADC clockA are separately supplied through two clock signal lines arranged along the ND converter 27. The ADC clockA and the ADC clockB that have phases different from each other by 180 degrees may be supplied from the outside of the solid-state image sensor as distinct signals or may be generated at any parts in the solid-state image sensor based on the clock signals supplied from the outside.

FIG. 8 illustrates generation of the least significant output bit based on two of the clock signals in the configuration of FIG. 7. The AND circuit 31A receives the ADC clockA represented by 8A and generates the output represented by 8B. The AND circuit 31B receives the ADC clockB represented by 8C and generates the output represented by 8D. In FIGS. 8, 8E represents an exclusive OR of the output signals represented by 8B and 8D.

Although the present invention is described based on illustrative aspects or embodiments, the present invention is not limited to the specifics of the illustrative aspects or embodiments. Other variations and modifications may be made within the scope of the claims appended hereto. For example, the A/D converter described herein is the column A/D converter. However, when the A/D converter counts the number of pulses of the clock signal to determine the value of the AD conversion, the A/D converter is not limited to the column A/D converter and similar effects may be obtained using the configurations described above.

The solid-state image sensor according to an aspect of the embodiment may be used for electronic circuits for capturing images in, for example, cellular telephone terminals, portable information equipment, auto focus (AF) parts of digital cameras or analog cameras, or personal computers (PCs).

According to an aspect of the embodiment described above, the A/D converter in which the frequency of the clock signal for the count of the ADC is reduced may be provided. The A/D converter is applicable to the solid-state image sensor.

According to an aspect of the embodiment described above, the frequency of the clock signal for the count of the ADC is substantially the same as the frequency of the least significant bit of the counter circuit. Thus, the frequency of the clock signal for the count of the ADC may be reduced by, for example, half while substantially the same frame period may be achieved with substantially the same resolution of the AD conversion.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A solid-state image sensor, comprising:
    a pixel array; and
    an analog to digital converter for converting a voltage signal read from the pixel array from analog to digital form,
    wherein the analog to digital converter includes a counter counting a first clock signal for a period depending on a voltage value of the voltage signal, and
    wherein a least significant bit of a count value of the counter is determined based on an exclusive OR of outputs of two 1-bit counters operating at a frequency of the first clock signal.

2. The solid-state image sensor according to claim 1,
    wherein the two 1-bit counters include a first 1-bit counter to which the first clock signal is input and a second 1-bit counter to which a second clock signal having a phase different from a phase of the first clock signal by 180 degrees is input.

3. The solid-state image sensor according to claim 2,
    wherein the analog to digital converter corresponds to each of a plurality of rows of the pixel array and includes a plurality of column analog to digital converters converting each of a plurality of voltage signals read from a designated column of the pixel array from analog to digital form.

4. The solid-state image sensor according to claim 3,
    wherein each of the column analog to digital converters includes an inverter inverting the first clock signal to generate the second clock signal.

5. The solid-state image sensor according to claim 3,
    wherein the first clock signal and the second clock signal are supplied to each of the column analog to digital converters through two clock signal lines arranged along the analog to digital converter including the column analog to digital converters.

6. An electronic circuit, comprising:
    a pixel array; and
    an analog to digital converter converting a voltage signal read from the pixel array from analog to digital form,
    wherein the analog to digital converter includes a counter counting a clock signal for a period depending on a voltage value of the voltage signal, and
    wherein a least significant bit of a count value of the counter is determined based on an exclusive OR of outputs of two 1-bit counters operating at a frequency of the clock signal.

* * * * *